United States Patent
Han et al.

(10) Patent No.: US 9,773,600 B2
(45) Date of Patent: Sep. 26, 2017

(54) MAGNET PLATE ASSEMBLY, DEPOSITION APPARATUS INCLUDING THE SAME, AND DEPOSITION METHOD USING THE SAME

(71) Applicant: Samsung Display Co., LTD., Yongin, Gyeonggi-Do (KR)

(72) Inventors: Jeongwon Han, Yongin (KR); Dosun Kim, Yongin (KR); Masao Nishiguchi, Yongin (KR); Youngmin Baik, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 140 days.

(21) Appl. No.: 14/752,075

(22) Filed: Jun. 26, 2015

(65) Prior Publication Data

US 2016/0078988 A1    Mar. 17, 2016

(30) Foreign Application Priority Data

Sep. 17, 2014 (KR) .................. 10-2014-0123711

(51) Int. Cl.
*H01F 7/02* (2006.01)
*C23C 14/04* (2006.01)
*H01L 51/56* (2006.01)

(52) U.S. Cl.
CPC ......... *H01F 7/0221* (2013.01); *C23C 14/042* (2013.01); *H01L 51/56* (2013.01)

(58) Field of Classification Search
None
See application file for complete search history.

(56) References Cited

U.S. PATENT DOCUMENTS

| 5,420,556 A * | 5/1995 | Okazaki ............... H01F 7/0284 335/210 |
| 2011/0131792 A1 | 6/2011 | Kwak et al. |
| 2014/0263908 A1* | 9/2014 | Franklin ............... F16M 13/02 248/309.4 |

FOREIGN PATENT DOCUMENTS

| KR | 1019990019724 A | 3/1999 |
| KR | 1020030047284 A | 6/2003 |
| KR | 1020030069679 A | 8/2003 |
| KR | 1020050035561 A | 4/2005 |
| KR | 1020080038650 A | 5/2008 |
| KR | 1020110017503 A | 2/2011 |
| KR | 1020110080049 A | 7/2011 |
| KR | 1020110128579 A | 11/2011 |
| KR | 1020120101662 A | 9/2012 |

* cited by examiner

*Primary Examiner* — Charles Capozzi
(74) *Attorney, Agent, or Firm* — H.C. Park & Associates, PLC

(57) ABSTRACT

A magnet plate assembly includes: a magnetic body; a magnet support which supports the magnetic body and has a first protrusion; a guide part which supports the magnet support and has a first opening through which the first protrusion passes; a first frame formed extending in a width direction of the magnet support, to accommodate the first protrusion; a first mother block which is disposed adjacent to one end side of the guide part, is contactable with one end of the guide part, and moves the guide part in a length direction; and a second mother block which is disposed adjacent to another end side of the guide part, is contactable with the other end of the guide part, and moves or fixes the guide part, wherein the first protrusion is formed slidable in the width direction on the first frame.

19 Claims, 6 Drawing Sheets

MAGNET PLATE ASSEMBLY, DEPOSITION APPARATUS INCLUDING THE SAME, AND DEPOSITION METHOD USING THE SAME

CLAIM OF PRIORITY

This application claims priority and all the benefits accruing under 35 U.S.C. 119 of Korean Patent Application No. 10-2014-0123711, filed on Sep. 17, 2014, in the Korean Intellectual Property Office ("KIPO"), the disclosure of which is incorporated herein in its entirety by reference.

BACKGROUND OF THE INVENTION

Field of the Invention

One or more exemplary embodiments relate to a magnet plate assembly, a deposition apparatus including the same, and a deposition method using the same.

Description of the Related Art

In general, among flat display apparatuses, an organic light-emitting display apparatus has been highlighted as a next-generation display apparatus since the organic light-emitting display apparatus is an active light-emitting display apparatus, has wide angles and good contrast, may be driven at a low voltage, may be formed to be lightweight and thin, and has quick response times.

A light-emitting device is classified as an inorganic light-emitting device or an organic light-emitting device based on the material used to form an emission layer. Compared with the inorganic light-emitting device, the organic light-emitting device has better characteristics in terms of brightness, response speed, and the like and enables to display colors. As a result, development of the organic light-emitting device is being conducted.

In an organic light-emitting display apparatus, an organic layer and/or an electrode is formed by a vacuum deposition method. However, as resolution of an organic light-emitting display apparatus is gradually increased, a width of an open slit of a mask used in a deposition process is gradually narrowed, and distribution of the width must be gradually reduced.

In addition, to manufacture a high-resolution organic light-emitting display apparatus, it is recommended that a shadow effect is reduced or removed. Accordingly, a deposition process is performed in a state where a mask is closely attached to a substrate, and development of a technique is emerging to increase adhesion between the substrate and the mask.

Information disclosed in this Background section was already known to the inventors before achieving the inventive concept or is technical information acquired in the process of achieving the inventive concept. Therefore, it may contain information that does not form the prior art that is already known to the public in this country.

SUMMARY OF THE INVENTION

One or more exemplary embodiments include a magnet plate assembly, a deposition apparatus including the same, and a deposition method using the same.

Additional aspects will be set forth in part in the description which follows and, in part, will be apparent from the description, or may be learned by practice of the presented embodiments.

According to one or more exemplary embodiments, a magnet plate assembly includes: a magnetic body having a predetermined magnetic force; a magnet support which supports the magnetic body and has a first protrusion; a guide part which supports the magnet support and has a first opening through which the first protrusion passes; a first frame formed extending in a first direction (i.e. a x-axis direction), which is a width direction of the magnet support, to accommodate the first protrusion; a first mother block which is disposed adjacent to one end side of the guide part, is contactable with one end of the guide part, and moves the guide part in a second direction (i.e. a y-axis direction) which crosses the first direction (i.e. the x-axis direction); and a second mother block which is disposed adjacent to another end side of the guide part, is contactable with the other end of the guide part, and moves the guide part or fixes the guide part such that the guide part does not move, wherein the first protrusion is formed slidable in the first direction (i.e. the x-axis direction) on the first frame.

The magnet support may include a first groove in which the magnetic body is seated.

The first opening may be formed in a third direction (i.e. a z-axis direction) different from the first and second directions (i.e. the x-axis and y-axis directions).

The guide part may further include a second groove on which the magnet support is seated, and the second groove may be formed to be wider than the magnet support.

The magnet plate assembly may further include a second frame formed extending in the second direction (i.e. the y-axis direction), wherein the guide part further includes a second protrusion which is accommodated in the second frame and slidable in the second direction (i.e. the y-axis direction) on the second frame.

The magnet plate assembly may further include a driving unit including at least one selected from the group consisting of a linear motor, a step motor, and a servo motor, wherein the driving unit is connected to one or more of the first and second mother blocks and moves the one or more of the first and second mother blocks.

The second mother block may include an elastic body which supports the other end of the guide part by an elastic force.

When the guide part moves in the second direction (i.e. the y-axis direction), the magnet support may move in the first direction (i.e. the x-axis direction).

According to one or more exemplary embodiments, a deposition apparatus includes: a deposition source for discharging a deposition material; a mask interposed between the deposition source and a substrate and through which the deposition material passes before being deposited on the substrate; and the magnet plate assembly for applying a predetermined magnetic force to the mask by being disposed on a surface of the substrate different from a surface of the substrate which contacts the mask.

The deposition apparatus may further include a cool plate which is interposed between the substrate and the magnet plate assembly and presses the substrate.

According to one or more exemplary embodiments, a deposition method includes: disposing a mask onto one surface of a substrate in a chamber; disposing a magnet plate assembly in a direction of another surface of the substrate; adjusting an arrangement of magnetic bodies by moving at least one of first and second mother blocks; and depositing a deposition material vaporized from a deposition source provided in the chamber onto the substrate through slits formed in the mask.

The magnet plate assembly may include: a magnetic body having a predetermined magnetic force; a magnet support which supports the magnetic body and has a first protrusion; a guide part which supports the magnet support and has a first opening through which the first protrusion passes; a first frame formed extending in a first direction (i.e. a x-axis direction), which is a width direction of the magnet support, to accommodate the first protrusion; a first mother block which is disposed adjacent to one end side of the guide part, is contactable with one end of the guide part, and moves the guide part in a second direction (i.e. a y-axis direction) which crosses the first direction (i.e. the x-axis direction); and a second mother block which is disposed adjacent to another end side of the guide part, is contactable with the other end of the guide part, and moves the guide part or fixes the guide part such that the guide part does not move, wherein the first protrusion is formed slidable in the first direction (i.e. the x-axis direction) on the first frame.

The first opening may be formed in a third direction (i.e. a z-axis direction) different from the first and second directions (i.e. the x-axis and y-axis directions).

The guide part may further include a second groove in which the magnet support is seated, and the second groove may be formed to be wider than the magnet support.

The magnet plate assembly may further include a second frame formed extending in the second direction (i.e. the y-axis direction), and the guide part may further include a second protrusion which is accommodated in the second frame and slidable in the second direction (i.e. the y-axis direction) on the second frame.

The magnet plate assembly may further include a driving unit including at least one selected from the group consisting of a linear motor, a step motor, and a servo motor, and the driving unit may be connected to one or more of the first and second mother blocks and moves the one or more of the first and second mother blocks.

The second mother block may include an elastic body which supports the other end of the guide part by an elastic force.

When the guide part moves in the second direction (i.e. the y-axis direction), the magnet support may move in the first direction (i.e. the x-axis direction).

The deposition method may further include pressing the substrate by moving a cool plate in a direction of the contacting surface between the magnet plate assembly and the substrate, between the disposing of the mask onto the one surface of the substrate in the chamber and the disposing of the magnet plate assembly in the direction of another surface of the substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
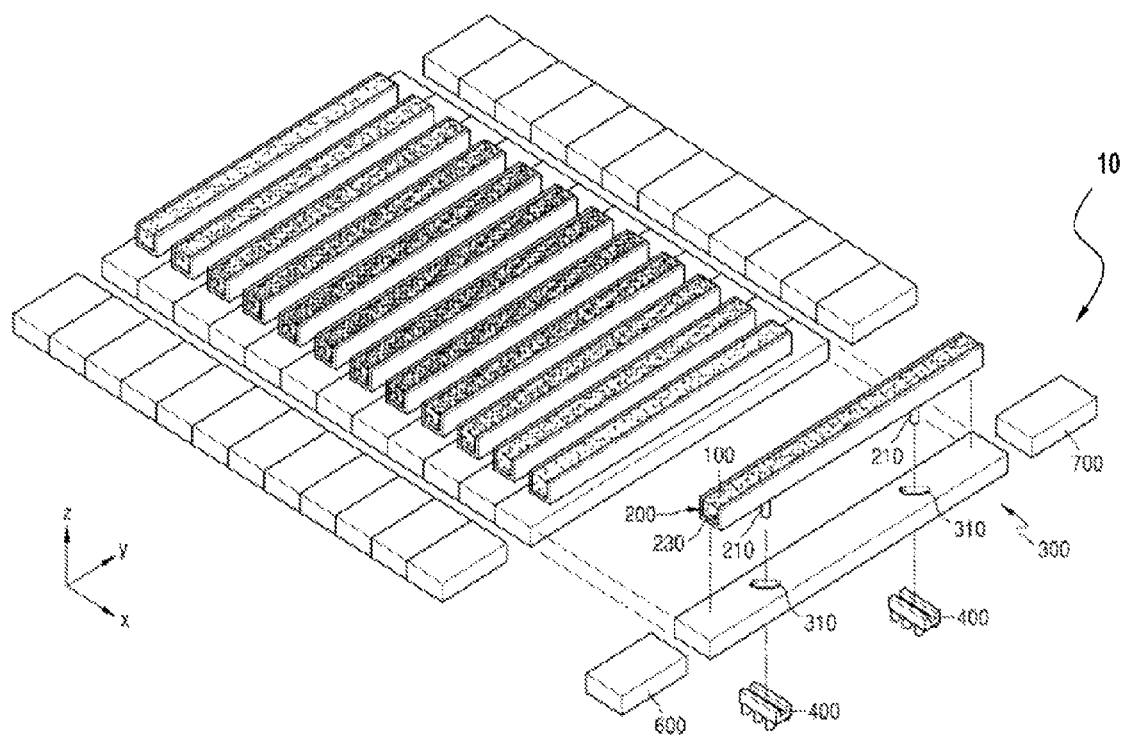
FIG. 1 is a conceptual diagram showing a schematic configuration of a magnet plate assembly according to an exemplary embodiment of the inventive concept.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. It will be understood that although the terms "first", "second", etc. may be used herein to describe various components, these components should not be limited by these terms. These components are only used to distinguish one component from another. As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings are arbitrarily illustrated for convenience of explanation, the following embodiments are not limited thereto. When a certain embodiment may be implemented differently, a specific process order may be performed differently from the described order. For example, two consecutively described processes may be performed substantially at the same time or performed in an order opposite to the described order.

Hereinafter, exemplary embodiments will be described in detail with reference to the accompanying drawings, and like reference numerals in the drawings denote like elements, and thus their repetitive description will be omitted.

As used herein, expressions such as "at least one of," when preceding a list of elements, modify the entire list of elements and do not modify the individual elements of the list.

Figure 2:
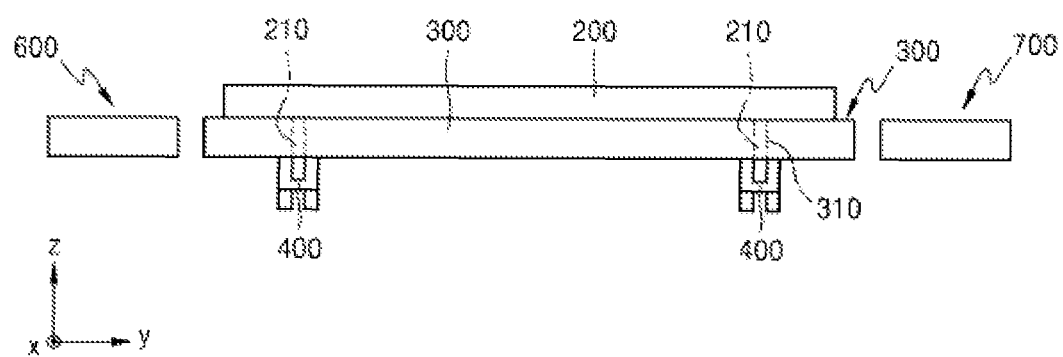
FIG. 2 is a side cross-sectional view of the magnet plate assembly of FIG. 1.

FIG. 1 is a conceptual diagram showing a schematic configuration of a magnet plate assembly 10 according to an exemplary embodiment of the inventive concept, and FIG. 2 is a side view of the magnet plate assembly 10 of FIG. 1.

Referring to FIGS. 1 and 2, the magnet plate assembly 10 includes a magnetic body 100, a magnet support 200, a guide part 300, a first frame 400, a first mother block 600, and a second mother block 700.

In detail, the magnet plate assembly 10 includes the magnetic body 100 having a predetermined magnetic force, the magnet support 200 which supports the magnetic body 100 and has a first protrusion 210, the guide part 300 which supports the magnet support 200 and has a first opening 310 through which the first protrusion 210 passes, the first frame 400 formed extending in a first direction (an x-axis direction in FIG. 1), which is a width direction of the magnet support 200, and to accommodate the first protrusion 210, the first mother block 600 which is disposed adjacent to one end side of the guide part 300 so as to be contactable with one end of the guide part 300 and moves the guide part 300 in a second direction (a y-axis direction in FIG. 1) which crosses the first direction (i.e. the x-axis direction), and the second mother block 700 which is disposed adjacent to the other end side of the guide part 300 so as to be contactable with the other end of the guide part 300 and fixes or moves the guide part 300 in the second direction (i.e. the y-axis direction), wherein the first protrusion 210 is formed so as to be slidable in the first direction (i.e. the x-axis direction) on the first frame 400.

The magnet plate assembly 10 may be disposed to be plural in number along the first direction (i.e. the x-axis direction), but a configuration and a coupling structure of one magnet plate assembly 10 will now be described for convenience of description.

In addition, although FIGS. 1 and 2 show only two first frames 400 for convenience of drawing, the present embodiment is not limited thereto, and a plurality of first frames 400 may be formed according to a length of the guide part 300.

The magnetic body 100 may be a permanent magnet as a component having a predetermined magnetic force, or may be any object capable of applying a magnetic force besides the permanent magnet. That is, an electromagnet may be used instead of the permanent magnet. The magnetic body 100 may be formed to be one in number by extending in the first direction (i.e. the x-axis direction) or to be plural in number by being divided into several pieces.

In addition, FIG. 1 illustrates a case where a cross-section of the magnetic body 100 is a quadrilateral, but besides, the magnetic body 100 may have various shapes, such as a polygon, a circle, an oval, and the like. However, the present embodiment is not limited thereto, and it will be understood by those of ordinary skill in the art that various modifications may exist besides those described above.

The magnet support 200 functions to support the magnetic body 100 and may have at least one first protrusion 210 on one side surface thereof. Although FIG. 1 shows that a first groove 230 included in the magnet support 200 accommodates the magnetic body 100, the present embodiment is not limited thereto, and the magnetic body 100 and the magnet support 200 may be arranged in a form that the magnetic body 100 is supported by one surface of the magnet support 200 without the first groove 230 in the same way as the guide part 300 supports the magnet support 200. The arrangement of the magnetic body 100 and the magnet support 200 in this form may be described below with reference to FIG. 4.

The guide part 300 supports the magnet support 200 and may include at least one first opening 310 through which the first protrusion 210 passes. The first opening 310 is formed in a third direction (i.e. a z-axis direction) other than the first and second directions (i.e. the x-axis and y-axis directions) in order for the first protrusion 210 passing through the first opening 310 to freely move in the third direction (i.e. the z-axis direction).

The first frame 400 is disposed on the other surface of the guide part 300, one surface of which contacts the magnet support 200, and is formed extending in the first direction (i.e. the x-axis direction) so as to accommodate the first protrusion 210. In this case, the first protrusion 210 passes through the first opening 310 of the guide part 300 and is accommodated in the first frame 400, and the first frame 400 may be formed of a linear motion (LM) guide and may function to guide so that the first protrusion 210 is slidable in the first direction (i.e. the x-axis direction).

The first mother block 600 is disposed adjacent to the one end side of the guide part 300 so as to be contactable with the one end of the guide part 300 and may function to move the guide part 300 in the first direction (i.e. the x-axis direction).

The second mother block 700 is disposed adjacent to the other end side of the guide part 300 so as to be contactable with the other end of the guide part 300 and may function to fix the guide part 300 such that the guide part 300 does not move or to move the guide part 300 as well as the first mother block 600.

In detail, the second mother block 700 may fix the guide part 300 by contacting the other side surface of the guide part 300, which is opposite to one side surface of the guide part 300 which contacts the first mother block 600, to prevent movement of the guide part 300 when the guide part 300 contacting the first mother block 600 and moving in a direction of the second mother block 700 slides without being fixed.

Figure 3:
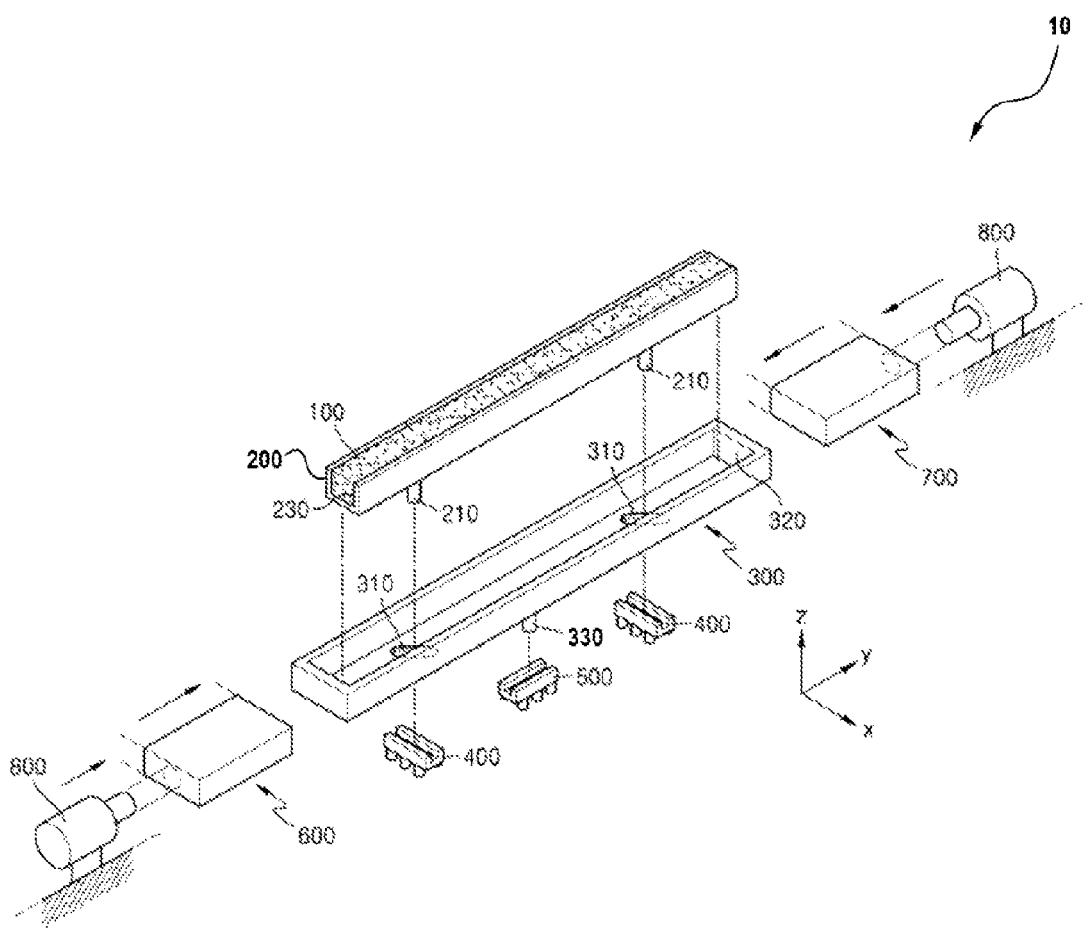
FIG. 3 is an exploded perspective view of a modified embodiment of a guide part in the magnet plate assembly of FIG. 1.

In addition, the first mother block 600 and the second mother block 700 may move by directly applying a force to the second mother block 700 by a person in a manual method or may move by a driving unit 800 for providing a separate driving force as shown in FIG. 3 to be described below.

FIG. 3 is an exploded perspective view of a modified embodiment of the guide part 300 in the magnet plate assembly 10 of FIG. 1.

As described above, the guide part 300 is formed so as to support the one surface of the magnet support 200 but is not limited thereto. For example, referring to FIG. 3, the guide part 300 may include a second groove 320 and be disposed in a form of accommodating the magnet support 200 in the second groove 320. However, in this case, it is recommended that a width of the second groove 320 is wider than that of the magnet support 200, and this is to provide a space in which the magnet support 200 is slidable in the second groove 320 and on the guide part 300.

The guide part 300 may further include a second protrusion 330, wherein the second protrusion 330 may be accommodated in a second frame 500 formed extending in the second direction (i.e. the y-axis direction) which crosses the first direction (i.e. the x-axis direction) in which the first frame 400 is formed extending. For example, the second frame 500 may be formed of an LM guide as well as the first frame 400 and may be formed extending in the second direction (i.e. the y-axis direction) and function to guide the second protrusion 220 to be slidable in the second direction (i.e. the y-axis direction).

The magnet plate assembly 10 according to one embodiment of the present inventive concept may further include the driving unit 800 for applying a force to the first mother block 600 and the second mother block 700 to move the first mother block 600 and the second mother block 700.

The driving unit 800 may move at least one of the first mother block 600 and the second mother block 700 by being connected to the at least one of the first mother block 600 and the second mother block 700. The driving unit 800 may include one selected from the group consisting of a linear motor, a step motor, and a servo motor, be connected to the first mother block 600 or the second mother block 700, and move the guide part 300 in the second direction (i.e. the y-axis direction) by applying a force in the second direction (i.e. the y-axis direction) to the one of the first mother block 600 and the second mother block 700.

Figure 4:
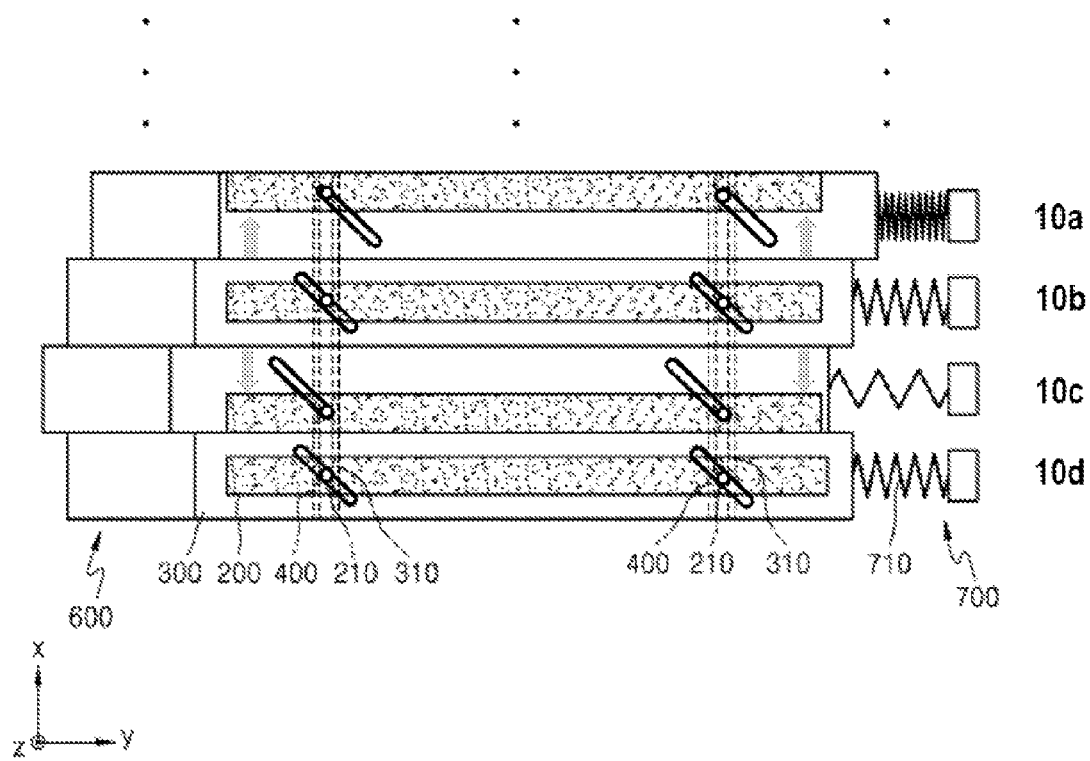
FIG. 4 is a partial top view of a second mother block in the magnet plate assembly of FIG. 1, which includes an elastic body.

FIG. 4 is a partial top view of the second mother block 700 in the magnet plate assembly 10 of FIG. 1, which includes an elastic body 710.

FIG. 4 illustrates the second mother block 700 including the elastic body 710. As described above, the second mother block 700 may function to fix the guide part 300 moving by the first mother block 600. Therefore, the elastic body 710 may support the other side surface of the guide part 300 in a contracted state when the first mother block 600 moves towards the second mother block 700 and may return the guide part 300 to its original state by an elastic force of the elastic body 710 when the first mother block 600 moves away from the second mother block 700.

Location changes of the magnetic body 100, the magnet support 200 and the guide part 300 according to movement of the first mother block 600 will now be described with reference to FIG. 4.

Reference numerals 10b and 10d indicate a case where a pressing force of the first mother block 600 is balanced with an elastic force of the elastic body 710. Reference numeral 10a indicates a case where the pressing force of the first mother block 600 is greater than the elastic force of the elastic body 710, and reference numeral 10c indicates a case where the pressing force of the first mother block 600 is less than the elastic force of the elastic body 710.

First, a state where the first mother block 600 presses the guide part 300 so as to make the elastic body 710 contracted is considered (refer to reference numeral 10a). When the first mother block 600 presses the guide part 300 the guide part 300 moves a direction of compressing the elastic body 710, i.e., the right direction. In this case, the first opening 310 formed in the guide part 300 also moves to the right. As such, when the guide part 300 moves to the right, the first protrusion 210 is located at a point where the first opening 310 and the first frame 400 overlap, and the first protrusion 210 moves the magnet support 200 upwards along a direction in which the first frame 400 is formed (refer to 10a in FIG. 4).

On the contrary, a state where the elastic body 710 is released since the elastic force of the elastic body 710 exceeds the pressing force of the first mother block 600 is considered (refer to reference numeral 10c). In this case, the first mother block 600 moves to the left, and accordingly, the guide part 300 also moves to the left, and thus, the first protrusion 210 is located at a point where the first opening 310 and the first frame 400 overlap, i.e., a lower side of the first opening 310. The positioning of the first protrusion 210 at the lower side of the first opening 310 indicates that the magnet support 200 has moved downwards on the guide part 300 and also indicates that the magnetic body 100 has moved downwards on the guide part 300 (refer to 10c in FIG. 4).

As described above, an effect which may be obtained by using the first mother block 600 and the second mother block 700 to adjust spacing between the magnetic bodies 100 will now be described.

To manufacture a high-resolution display apparatus, it is recommended that a shadow effect occurring in a deposition process of an organic material, i.e., a deposition material, is reduced. The shadow effect occurs due to a gap existing between a mask and a substrate on which the deposition material is to be deposited. The deposition material passes through slits of the mask and then is deposited onto the substrate. To reduce the shadow effect, it is recommended that the gap between the substrate and the mask is minimized to increase adhesion between the substrate and the mask so that the connection between the mask and the substrate is maintained.

To solve this problem of shadow effect, according to the related art, a mask is closely attached to a substrate by disposing a plurality of materials for generating a predetermined magnetic force as well as the magnetic body 100 in a width direction (the first direction, i.e. the x-axis direction) of a structure having the same function as the guide part 300 for supporting the magnetic body 100 and by applying a magnetic force to the mask in a state where the substrate is interposed between the mask and the plurality of materials.

However, when the magnetic bodies 100 are continuously disposed along the first direction (i.e. the x-axis direction) with constant spacing as in the related art, a magnetic force formed by the magnetic bodies 100 is determined according to the arrangement of the magnetic bodies 100. Once the magnetic body 100 is fixed to the guide part 300 and used in a deposition process, a lot of time and expenses are consumed to change the arrangement of the magnetic bodies 100 in the future, and thus, once the magnetic bodies 100 are arranged, it is realistically difficult to change the intensity or distribution of a magnetic force in a deposition process unless the arrangement of the magnetic bodies 100 is changed.

To solve this problem, the magnet plate assembly 10 according to one or more embodiments of the inventive concept includes the first mother block 600 capable of changing the arrangement of the magnetic body 100 by moving the guide part 300 in the second direction (i.e. the y-axis direction) and the second mother block 700 for fixing or moving the guide part 300.

As such, when the first mother block 600 and the second mother block 700 are provided so that the magnet support 200 is slidably movable on the guide part 300, the magnetic body 100 supported by the magnet support 200 may slidably move in the first direction (i.e. the x-axis direction) and on the guide part 300, and this indicates that spacing between magnetic bodies 100 is adjustable by moving the first mother block 600 and the second mother block 700.

When the magnetic body 100 is disposed plural in number in the second direction (i.e. the y-axis direction), a predetermined magnetic force may be formed. In this case, when spacing between the plurality of magnetic bodies 100 is adjusted using the first mother block 600 and the second mother block 700, the intensity and distribution of the magnetic force formed by the magnetic bodies 100 may be changed, and as a result, a uniform magnetic force may be applied to the entire area of the mask by adjusting the magnetic force according to a change in an external environment. Accordingly, adhesion between the mask and the substrate may increase, thereby resulting in reduced shadow effect occurrence in a deposition process.

Figure 5:
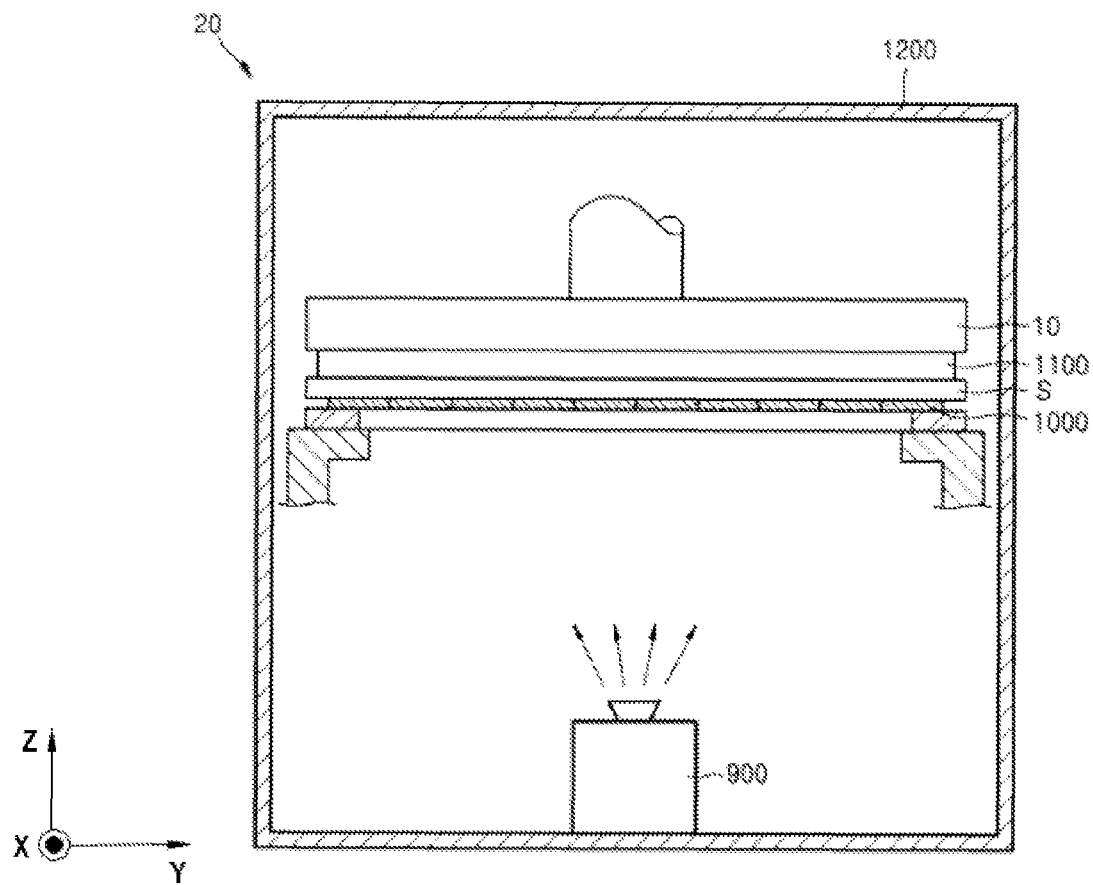
FIG. 5 is a conceptual diagram showing a schematic cross-section of a deposition apparatus including the magnet plate assembly of FIG. 1, according to another embodiment of the inventive concept.

FIG. 5 is a conceptual diagram showing a schematic cross-section of a deposition apparatus 20 including the magnet plate assembly 10 of FIG. 1, according to another embodiment of the inventive concept.

The deposition apparatus 20 according to another embodiment of the inventive concept may include a deposition source 900 for discharging a deposition material towards a substrate S, a mask 1000 interposed between the deposition source 900 and the substrate S to pass the deposition material therethrough so that the deposition material is deposited on the substrate S, and the magnet plate assembly 10 according to an embodiment of the inventive concept, which is disposed on the other surface of the substrate S, one surface of which contacts the mask 1000, to apply a predetermined magnetic force to the mask 1000.

In addition, the deposition apparatus 20 may further include a cool plate 1100 interposed between the substrate S and the magnet plate assembly 10 to press the substrate S by a weight thereof. The cool plate 1100 functions to increase adhesion between the substrate S and the mask 1000 before the magnet plate assembly 10 moves towards the substrate S and applies a magnetic force to the mask 1000.

Figure 6:
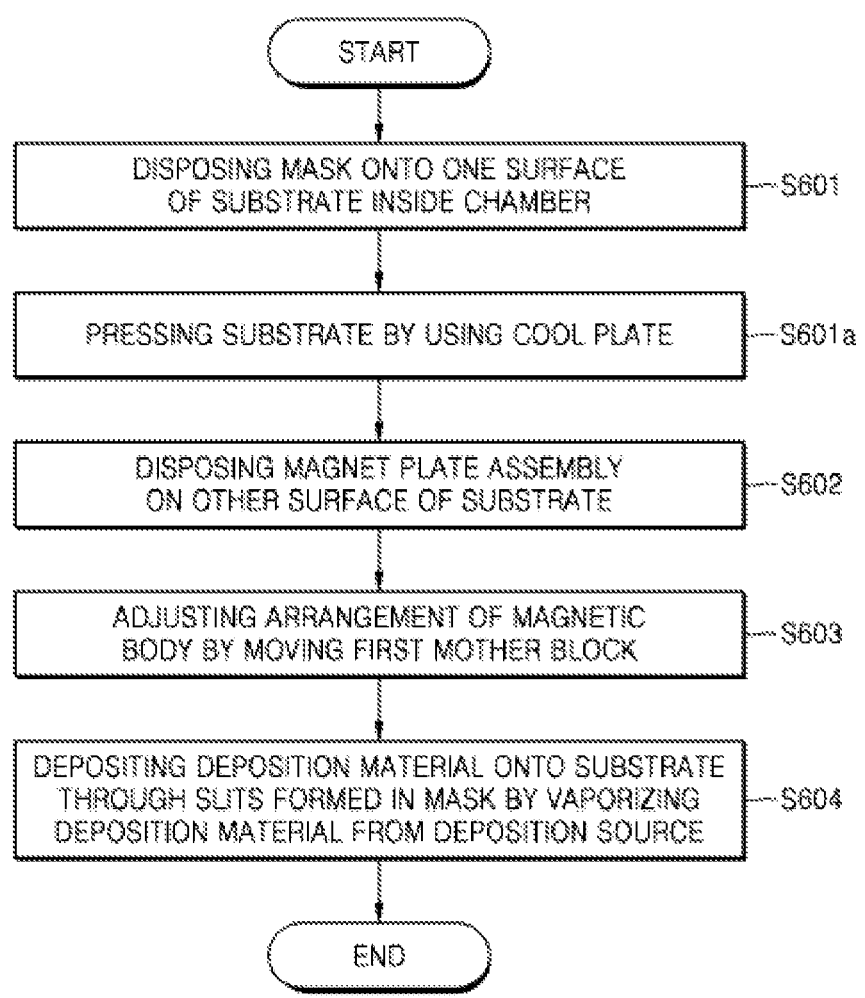
FIG. 6 is a flowchart of a deposition method using the magnet plate assembly of FIG. 1, according to another embodiment of the inventive concept.

FIG. 6 is a flowchart of a deposition method of depositing a deposition material on the substrate S by using the magnet plate assembly 10 of FIG. 1, according to another embodiment of the inventive concept.

The deposition method using the magnet plate assembly 10, according to another embodiment of the inventive concept, will now be described.

Referring to FIGS. 5 and 6, the mask 1000 is disposed on one surface of the substrate S inside a chamber 1200 in operation 5601. In operation 5602, the magnet plate assembly 10 is disposed on the other surface of the substrate S. In operation 5603, a magnetic force applied to the mask 1000 is controlled by moving the first mother block 600 to adjust arrangement of the magnetic body 100. In operation 5604, the deposition material vaporized from the deposition source 900 provided in the chamber 1200 is deposited on the substrate S through slits (not shown) formed in the mask 1000.

The deposition method may further include operation 5601*a* of pressing the substrate S by moving the cool plate 1100 to the substrate S, between the operation of disposing the mask 1000 on the one surface of the substrate S inside the chamber 1200 and the operation of disposing the magnet plate assembly 10 on the other surface of the substrate S.

As described above, according to the one or more of the above exemplary embodiments, a gap between a substrate and a mask may be minimized by applying a uniform magnetic force to the mask by a magnetic plate assembly, a deposition apparatus including the same, and a deposition method using the same, thereby precisely depositing a deposition material on the substrate.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A magnet plate assembly comprising:
 a magnetic body having a predetermined magnetic force;
 a magnet support which supports the magnetic body and has a first protrusion;
 a guide part which supports the magnet support and has a first opening through which the first protrusion passes;
 a first frame formed extending in a first direction, which is a width direction of the magnet support, to accommodate the first protrusion;
 a first mother block which is disposed adjacent to one end side of the guide part, is contactable with the one end side of the guide part, and moves the guide part in a second direction which crosses the first direction; and
 a second mother block which is disposed adjacent to another end side of the guide part, is contactable with the other end side of the guide part, and moves the guide part or fixes the guide part such that the guide part does not move,
 wherein the first protrusion is slidable in the first direction on the first frame.

2. The magnet plate assembly of claim 1, wherein the magnet support comprises a first groove in which the magnetic body is seated.

3. The magnet plate assembly of claim 1, wherein the first opening is formed in a third direction different from the first and second directions.

4. The magnet plate assembly of claim 1, wherein the guide part further comprises a second groove in which the magnet support is seated, and
 the second groove is formed to be wider than the magnet support.

5. The magnet plate assembly of claim 1, further comprising
 a second frame formed extending in the second direction,
 wherein the guide part further comprises a second protrusion which is accommodated in the second frame and slidable in the second direction on the second frame.

6. The magnet plate assembly of claim 1, further comprising
 a driving unit including at least one selected from the group consisting of a linear motor, a step motor, and a servo motor,
 wherein the driving unit is connected to one or more of the first and second mother blocks and moves the one or more of the first and second mother blocks.

7. The magnet plate assembly of claim 1, wherein the second mother block comprises an elastic body which supports the other end of the guide part by an elastic force.

8. The magnet plate assembly of claim 1, wherein when the guide part moves in the second direction, the magnet support moves in the first direction.

9. A deposition apparatus comprising:
 a deposition source for discharging a deposition material;
 a mask interposed between the deposition source and a substrate and through which the deposition material passes before being deposited on the substrate; and
 the magnet plate assembly of claim 1,
 is disposed on a surface of the substrate different from a surface of the substrate which contacts the mask, and applies a predetermined magnetic force to the mask.

10. The deposition apparatus of claim 9, further comprising a cool plate which is interposed between the substrate and the magnet plate assembly and presses the substrate.

11. A deposition method comprising:
 disposing a mask onto one surface of a substrate in a chamber;
 disposing a magnet plate assembly in a direction of another surface of the substrate;
 adjusting an arrangement of magnetic body by moving at least one of first and second mother blocks; and
 depositing a deposition material vaporized from a deposition source provided in the chamber onto the substrate through slits formed in the mask,
 wherein the magnet plate assembly comprises:
 a magnetic body having a predetermined magnetic force;
 a magnet support which supports the magnetic body and has a first protrusion;
 a guide part which supports the magnet support and has a first opening through which the first protrusion passes;
 a first frame formed extending in a first direction, which is a width direction of the magnet support, to accommodate the first protrusion;
 a first mother block which is disposed adjacent to one end side of the guide part, is contactable with the one end side of the guide part, and moves the guide part in a second direction which crosses the first direction; and a second mother block which is disposed adjacent to another end side of the guide part, is contactable with the other end side of the guide part, and moves the guide part or fixes the guide part such that the guide part does not move, wherein the first protrusion is formed slidable in the first direction on the first frame.

12. The deposition method of claim 11, wherein the magnet support comprises a first groove in which the magnetic body is seated.

13. The deposition method of claim 11, wherein the first opening is formed in a third direction different from the first and second directions.

14. The deposition method of claim 11, wherein the guide part further comprises a second groove in which the magnet support is seated, and the second groove is formed to be wider than the magnet support.

15. The deposition method of claim 11, wherein the magnet plate assembly further comprises a second frame formed extending in the second direction, and the guide part further comprises a second protrusion which is accommodated in the second frame and slidable in the second direction on the second frame.

16. The deposition method of claim 11, wherein the magnet plate assembly further comprises a driving unit including at least one selected from the group consisting of a linear motor, a step motor, and a servo motor, and the driving unit is connected to one or more of the first and second mother blocks and moves the one or more of the first and second mother blocks.

17. The deposition method of claim 11, wherein the second mother block comprises an elastic body which supports the other end of the guide part by an elastic force.

18. The deposition method of claim 11, wherein when the guide part moves in the second direction, the magnet support moves in the first direction.

19. The deposition method of claim 11, further comprising pressing the substrate by moving a cool plate between the magnet plate assembly and the substrate, between the disposing of the mask onto the one surface of the substrate in the chamber and the disposing of the magnet plate assembly in the direction of the other surface of the substrate.

* * * * *